United States Patent [19]

Burckhartt et al.

[11] Patent Number: 5,956,475
[45] Date of Patent: *Sep. 21, 1999

[54] COMPUTER FAILURE RECOVERY AND ALERT SYSTEM

[75] Inventors: David M. Burckhartt; Lazaro D. Perez; Theodore F. Emerson, all of Houston; Randolph O. Dow, Cypress; Gary A. Stimac, Montgomery, all of Tex.

[73] Assignee: Compaq Computer Corporation, Houston, Tex.

[ * ] Notice: This patent is subject to a terminal disclaimer.

[21] Appl. No.: 08/768,681

[22] Filed: Dec. 18, 1996

Related U.S. Application Data

[63] Continuation of application No. 08/390,499, Jan. 26, 1995, Pat. No. 5,596,711, which is a continuation of application No. 07/955,849, Oct. 2, 1992, Pat. No. 5,390,324.

[51] Int. Cl.⁶ .................................................. G06F 11/34
[52] U.S. Cl. ............................... 395/182.21; 395/183.12
[58] Field of Search ........................ 395/182.14, 182.18, 395/182.21, 185.01, 185.08, 183.12, 183.21, 185.1

[56] References Cited

U.S. PATENT DOCUMENTS

| | | | |
|---|---|---|---|
| 4,063,311 | 12/1977 | Jeremiah et al. | 364/900 |
| 4,234,926 | 11/1980 | Wallace et al. | 364/551 |
| 4,697,266 | 9/1987 | Finley | 371/12 |
| 4,802,119 | 1/1989 | Heene et al. | 364/900 |
| 4,956,807 | 9/1990 | Hosaka et al. | 371/62 |
| 4,977,399 | 12/1990 | Price et al. | 340/825.44 |
| 4,999,838 | 3/1991 | Horikawa | 371/16.1 |
| 5,113,504 | 5/1992 | Matsuda | 371/62 |
| 5,153,881 | 10/1992 | Bruckert et al. | 371/11.3 |
| 5,155,856 | 10/1992 | Bock et al. | 395/800 |
| 5,233,613 | 8/1993 | Allen et al. | 371/16.1 |
| 5,251,227 | 10/1993 | Bruckert et al. | 371/12 |
| 5,313,625 | 5/1994 | Hess et al. | 395/575 |
| 5,325,520 | 6/1994 | Nguyen et al. | 395/575 |
| 5,345,583 | 9/1994 | Davis | 395/182.21 |
| 5,379,436 | 1/1995 | Tanaka | 395/750 |
| 5,410,706 | 4/1995 | Farrand et al. | . |
| 5,511,161 | 4/1996 | Sato et al. | 395/182.21 |

FOREIGN PATENT DOCUMENTS

| | | |
|---|---|---|
| 0 448 497 | 9/1991 | European Pat. Off. . |
| 0 503 920 | 9/1992 | European Pat. Off. . |
| WO86/02183 | 4/1986 | WIPO . |
| WO90/13213 | 11/1990 | WIPO . |

OTHER PUBLICATIONS

EPO Abstract No. 90–029493 Entitled Dual Function ROM Controlling Initial Program Load—Has Control Microcode with Boot Subroutines Containing Added Decision Making Paths and Set–Up Code, Abstract Only.

Multiple Bootable Operating System, IBM Technical Disclosure Bulletin, vol. 35, No. 1A, Jun. 1992, pp. 311–314.

(List continued on next page.)

*Primary Examiner*—Joseph E. Palys
*Attorney, Agent, or Firm*—Sharp, Comfort & Merrett, P.C.

[57] ABSTRACT

A computer system includes a timer which times out if the operating system does not periodically reset the timer. When the system fails and no longer resets the timer, the timer times out, and the computer is reset. The system performs its power on program and checks the memory array for bad memory blocks, which are mapped out of the memory. Next, the system alerts the operator of the failure using a pager. The system then reboots itself from a hard drive having two separate bootable partitions, one for the operating system in the first partition, and one for a diagnostics program in the second partition, so that an operator may diagnose and remedy the problem. The operator may set an indication of which partition to use for booting. The system further provides for remote access so that the operator may interact with the diagnostics program from a remote location.

16 Claims, 14 Drawing Sheets

OTHER PUBLICATIONS

Unattended System Monitor, IBM Technical Disclosure Bulletin, vol. 33, No. 3A, Aug. 1990, pp. 453–457.

Hardware Boot Device, IBM Technical Disclosure Bulletin, vol. 33, No. 5, Oct. 1990, pp. 370–371.

IPL Record Extension for Alternate Boot Programs, Research Disclosure, No. 307, New York, U.S., Nov. 1989.

Data Terminal Equipment Remotely Powered by a Modem Equipped with a Contact Sense/Operate Facility, IBM Technical Disclosure Bulletin, vol. 26, No. 12, May 1984, pp. 6484–6485.

COMPUTER FAILURE RECOVERY AND ALERT SYSTEM

This is a continuation, of U.S. application Ser. No. 08/390,499, filed Jan. 26, 1995, now U.S. Pat. No. 2,596, 711, which is in turn a continuation of U.S. application Ser. No. 07/955,849, filed Oct. 2, 1992, issued as U.S. Pat. No. 5,390,324.

BACKGROUND OF THE INVENTION

1. Field of the Invention

The invention relates to computer failure recovery systems, and more particularly, to a failure recovery system that automatically resets and boots the computer upon a system failure, alerts the administrator of the error and can load diagnostic software.

2. Description of the Related Art

Even with today's advanced computer systems, errors occur which cause an entire computer system to fail. Critical errors can occur due to failure of a component in the system that occupies a critical position in the computer architecture, or the error may be caused by a memory failure that must be remedied to continue. Whatever the cause, a critical error causing a system failure cripples the entire computer system, often rendering millions of dollars of equipment idle and leaving its users frustrated.

To recover, personal computers require manual assistance from an operator to reset the system and execute power up and boot procedures. If the computer administrator is not available at the time the system fails, it may be hours or even days before the computer administrator arrives and the system returns to operations, especially for a small company without an administrator on staff. Furthermore, even if the system may be rebooted without any particular expertise, the source of the error must be diagnosed and repaired before the system is again acceptably reliable. Consequently, a person knowledgeable of the system must be on hand at all times to keep the system running, or the computer system must remain idle until the computer administrator arrives and performs his duties.

In some cases, the system failure may not even be noticed until long after it occurs. In many applications, computer systems operate in remote locations without regular attendance. If the system fails, no means are available to notify the owner of the system failure, and there is no way of bringing the system back to operational status. Even if the system reboots, the cause of the error cannot be diagnosed and remedied until the administrator is notified and gains access to the system to remedy the problem.

SUMMARY OF THE PRESENT INVENTION

A computer system according to the present invention includes an automatic system recovery (ASR) timer which times out if the operating system does not periodically reset the timer. When the timer times out, it resets the computer system. Under normal operating conditions, the operating system continuously resets the timer so that the timer never times out. When the system fails, however, the operating system does not reset the timer, so the timer times out, signaling a system failure and causing a system reset.

After the reset, the system determines the source of the system reset, and if the reset was caused by the automatic system recovery timer, the system performs its power on program and checks the memory array for bad memory blocks, as this is the most common source of fatal errors. Bad memory blocks are mapped out of the memory so that they remain unused. At the user's option, the system then reboots itself from the hard drive's primary partition to the operating system to continue normal operations, or from a secondary partition of the hard drive to a diagnostics program, so that an operator may diagnose and remedy the problem.

In addition, the computer system may dial a pager number to alert an administrator of the system failure. The system may also seek a connection to a remote terminal, or receive instructions through a modem so that the diagnostics program may be executed by an operator from a remote terminal to return the system to operational status. Thus, the system quickly restores the operations of the computer downed by a critical error, regardless of whether the system is attended or unattended. In addition, the computer system alerts the administrator, assists the quick diagnosis of the cause of the error, and allows its correction.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
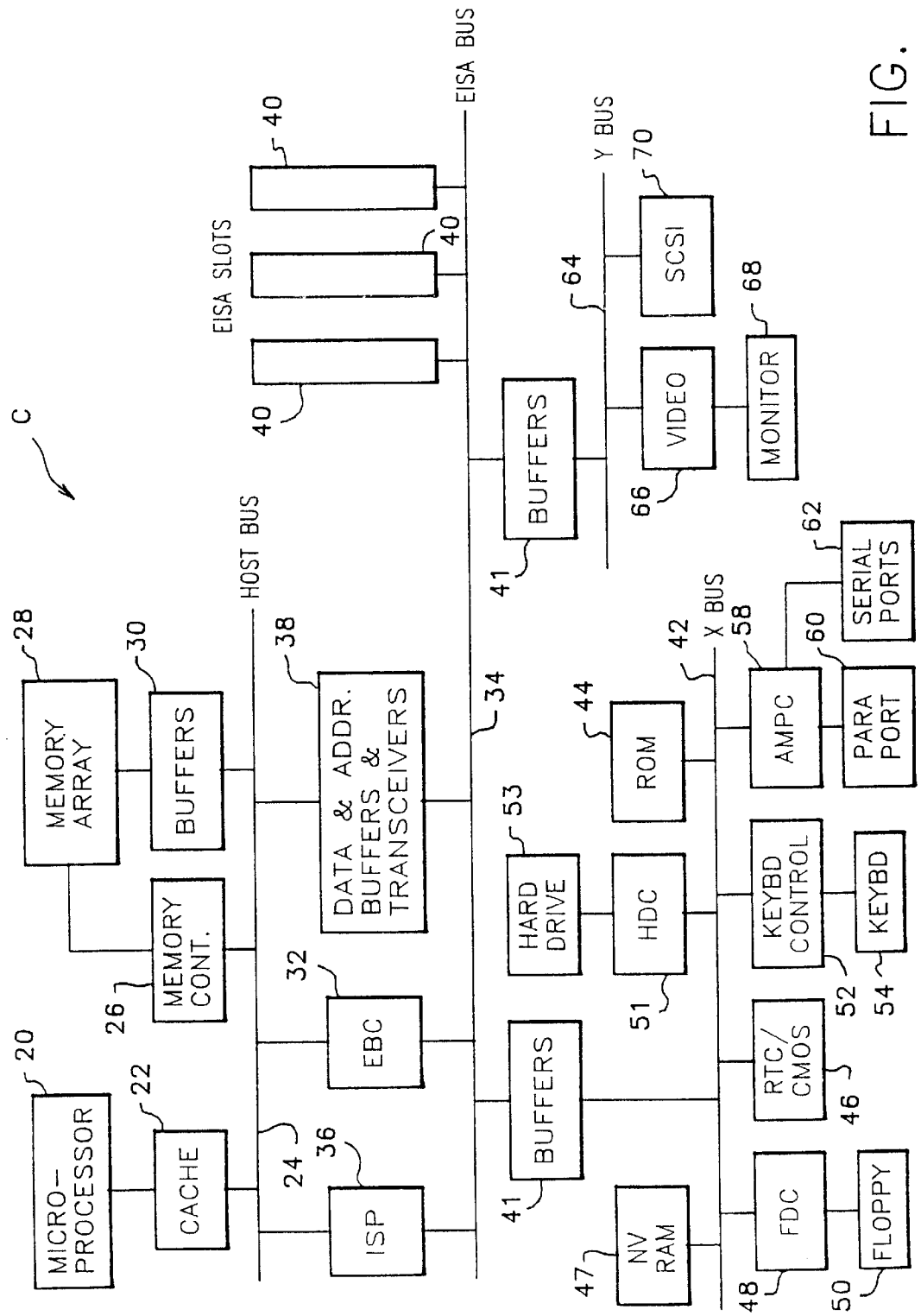
FIG. 1 is a block diagram of a computer system incorporating the present invention.

Referring now to FIG. 1, a computer system C having an automatic system recovery (ASR) capability according to the present invention is shown. A microprocessor 20, preferably an 80486 from Intel Corporation, is connected to a cache controller 22. The cache controller 22 in turn is connected to a host bus 24 which includes address, data and control portions. A memory controller 26 is connected to the host bus 24 to receive and control main memory operations. The memory controller 26 is connected to the main memory array 28 of the computer C, with the data from the main memory array 28 going through a data buffer 30 to the host bus 24.

Also connected to the host bus 24 is in an EISA bus controller (EBC) 32 which handles translation of signals between the host bus 24 and an EISA bus 34, the input/output bus preferably used. It is of course understood that other I/O buses could be utilized. The EBC 32 is connected to an integrated system peripheral (ISP) 36 which includes a DMA controller, timers, interrupt controller, EISA bus arbiter and other devices as necessary and common in an EISA system. The ISP 36 is connected to the host bus 24 and the EISA bus 34. In addition, the EBC 32 is connected to a series of address and data latches and transceivers 38 which are connected to the host bus 24 and EISA bus 34 and provide the necessary address and data latching and buffering to allow development of an EISA system. Also connected to the EISA bus 34 are a series of EISA slots 40 which receive interchangeable circuit boards.

Two additional buses are developed from the EISA bus 34. Each additional bus is connected through a set of buffers 41 to the EISA bus 34. The first of these is referred to as the X bus 42 which is conventionally a 16-bit bus used to connect with the majority of support chips present on system board of the computer system C. For example, these support chips include a read only memory (ROM) 44; a real time clock (RTC) and CMOS memory 46; non-volatile memory 47; a floppy disk controller 48, which in turn is connected to a floppy disk drive 50; a hard disk controller 51 and hard disk drive 53; an 8042 keyboard controller 52, which is in turn connected to a keyboard 54 and a pointing device (not shown); and a multiple peripheral controller (AMPC) 58 which provides a parallel port 60 and a series of serial ports 62. These are devices which are conventional in a small computer system C such as the one shown and are provided to indicate a complete computer and are not necessarily related to the present invention.

A second bus developed from the EISA bus 34 is the Y bus 64, which is preferably a 32-bit bus to allow high data rate transfers to the EISA bus 34. A video controller 66 and its associated monitor 68 are connected to the Y bus 64. A small computer system interface (SCSI) subsystem 70 includes a bus master interface, an SCSI controller and an SCSI port which is used to connect to SCSI devices.

The hard drive 53 is normally used to boot up the computer system C when the computer is power cycled, but it is understood that a hard drive connected to the SCSI port could also be used to boot the computer system C. When the system is booting, the computer looks for a bootable partition on the hard drive 53 having a program from which the computer may boot. The hard drive 53 of the present computer includes two bootable partitions. The primary partition includes the operating system and all of the system files. To operate the system in its usual configuration, the primary partition is accessed when booting up to boot to the operating system. The secondary partition is a smaller, specialized partition, which includes a configuration program, a diagnostics program, and a reduced operating system for basic, minimal operations. In the preferred embodiment, the secondary partition occupies approximately 2 Mbytes of the hard drive. The user may select to boot to the configuration or diagnostics program and access the secondary partition without first accessing the primary partition by depressing a particular key at the proper time in the POST (Power on Self Test) procedure.

Figure 2:
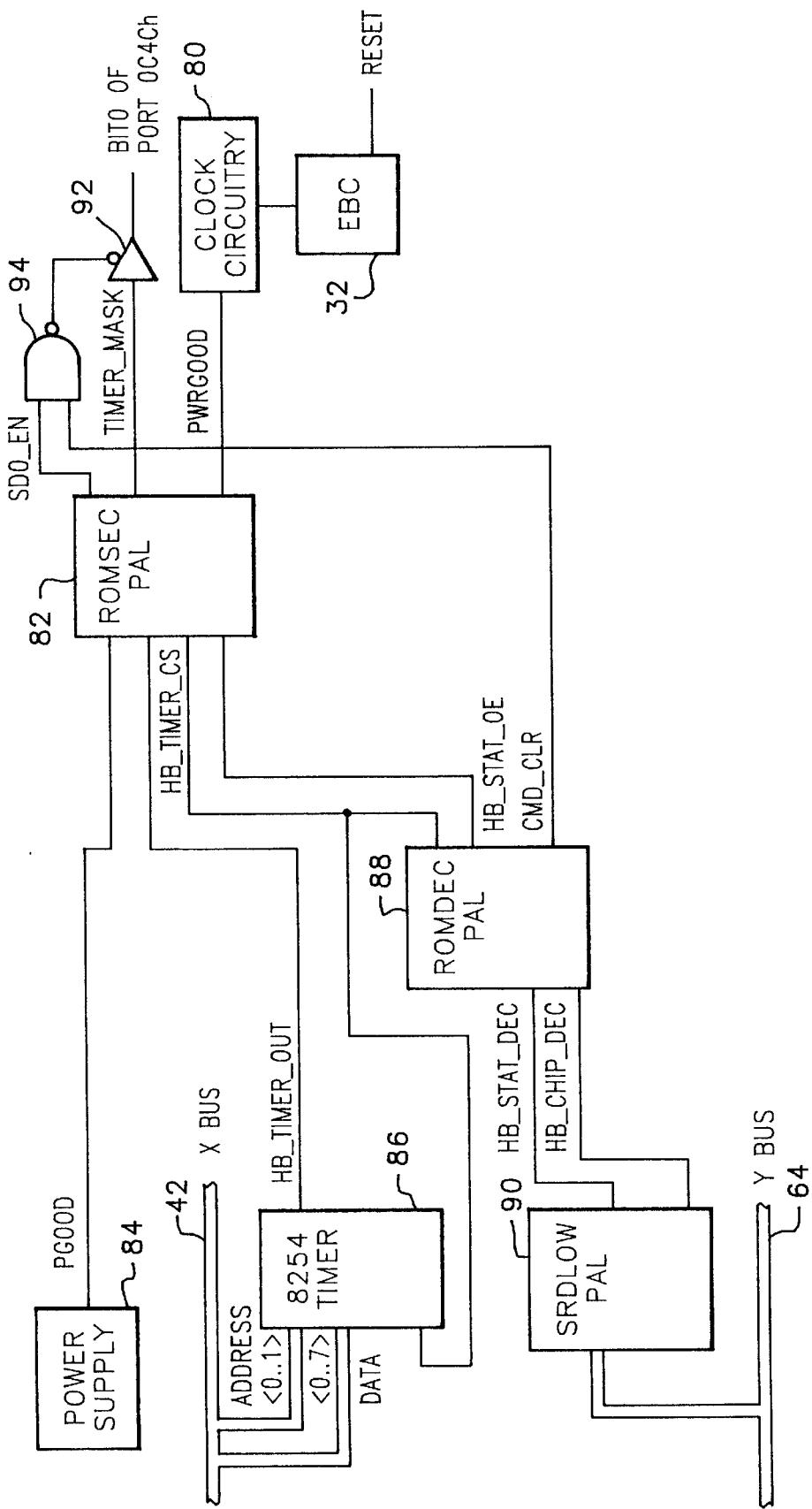
FIG. 2 is a block diagram of the automatic system recovery (ASR) control circuitry for resetting the computer system in the event of a system failure.

Referring now to FIG. 2, the ASR system resets the computer system C by providing a signal to clock circuitry 80 included in the computer system C. The clock circuitry 80 includes reset detection circuitry that generates a reset signal when a power good (PWRGOOD) signal provided by the ASR system asserts a logic level low pulse. When the pulse is received, the clock circuitry 80 asserts a reset signal to the EBC 32, which in turn generates a RESET signal that causes each of the components receiving the signal to reset.

The PWRGOOD signal is provided by a programmable array logic (PAL) device referred to as the ROMSEC PAL 82. The ROMSEC PAL 82 generates the PWRGOOD signal according to the following equation:

PWRGOOD=PGOOD * (TIMER_MASK+HB_TIMER_OUT)

The ROMSEC PAL 82 receives the power supply good (PGOOD) signal from a system power supply 84. The power supply 84 provides power to each component in the computer C. When the power supply 84 fails or is power cycled, the entire system C must be reset. The PGOOD signal is generated by a pulse shaping circuit located in the power supply 84, so that as long as the power supply 84 maintains a steady 5 volt output signal, the PGOOD signal remains high.

The ROMSEC PAL 82 receives the ASR timer timeout signal (HB_TIMER_OUT) from an ASR timer 86. When a critical error occurs and the computer fails, the ASR timer 86 initiates a system reset after the timer times out by asserting the HB_TIMER_OUT signal. In the preferred embodiment, the ASR timer 86 is an 82C54 timer circuit from Intel Corporation. The 16-bit ASR timer 86 is accessible via two I/O port addresses, 0C48h and 0C4Bh. In the preferred embodiment, the ASR timer 86 is loaded by writing a user-selected countdown value to I/O port 0C48h. The ASR timer 86 is loaded in two bytes, and after the second byte is written, the ASR timer 86 is loaded and its output is enabled on the rising edge of the next clock cycle.

After the ASR timer 86 is loaded and its output is enabled, the ASR timer 86 begins to count down from the initial countdown value. The ASR timer 86 of the preferred embodiment counts down for a maximum of approximately 38 minutes with 0.0355 seconds resolution. When the timer count expires, the ASR timer 86 drives the HB_TIMER_OUT signal low for about 36 ms, with the HB_TIMER_OUT signal being provided to the ROMSEC PAL 82. The low HB_TIMER_OUT pulse causes the computer C to reset, unless the PWRGOOD signal is masked, as described below. After a timeout occurs, the ASR timer 86 stops counting and its output is disabled until the ASR timer 86 is loaded with another countdown value.

The PWRGOOD signal is also affected by a TIMER_MASK signal. The TIMER_MASK signal masks the ASR timer 86 HB_TIMER_OUT signal, so that the PWRGOOD signal is driven low by the HB_TIMER_OUT signal only if the TIMER_MASK signal is negated. The masking signal is necessary because the ASR timer 86 powers up with a random countdown value, and the TIMER_MASK signal prevents the ASR timer 86 from inadvertently resetting the system by negating the HB_TIMER_OUT signal when the ASR timer 86 times out during a system POST test or boot procedure shortly after power up.

Two other signals are associated with the ASR system. The first signal is the HB_TIMER_CS signal, or ASR timer circuit select signal, which is activated during I/O accesses to the ASR timer address range 0C48-0C4Bh. The HB_TIMER_CS signal is provided to the ASR timer 86 and the ROMSEC PAL 82 for addressing purposes. The HB_TIMER_CS signal is generated by a second PAL, referred to as the ROMDEC PAL 88, which generates the HB_TIMER_CS signal according to the following equation:

HB_TIMER_CS =

/MIO * /RESET * HBCHIP_DEC * START +

/MIO * /RESET * HBCHIP_DEC * HB_TIMER_CS +

HB_TIMER_CS * /START

The MIO (memory I/O) and START signals are both control signals generated by the EBC 32 for conventional I/O port accesses. The RESET signal is the system reset signal generated by the EBC 32 and provided to the entire system in response to the negation of the PWRGOOD signal or another reset condition. Thus, the first term of the above equation causes the HB_TIMER_CS signal to be asserted when the ASR timer address space is accessed. The other two terms perform deglitch functions.

The HB_CHIP_DEC signal is provided to the ROM-DEC PAL 88 from a third PAL, referred to as the SRDLOW PAL 90. The SRDLOW PAL 90 is a system ROM decode PAL connected to the Y address bus which asserts the HB_CHIP_DEC signal during accesses to the ASR timer circuit address range. The HB_CHIP_DEC signal is only partially decoded, so that it is asserted for accesses to addresses 0C48-0C4Bh.

The ROMDEC PAL 88 also provides the HB_STATOE signal to the ROMSEC PAL 82. This signal is the ASR status output enable signal, which is generated during I/O accesses to the ASR status port at address 0C4Ch. The HB_STATOE signal is asserted and provided to the ROMSEC PAL 82 to read the TIMER_MASK signal and to write to the status port to disable the TIMER_MASK signal. The HB_STATOE signal is generated according to the following equation:

HB_STATOE = (/MIO * /RESET * HB_STAT_DEC) * START +

(/MIO * /RESET * HB_STAT_DEC) * HB_STATOE +

HB_STATOE * /START

The first term of the equation causes the HB_STATOE signal to be asserted during accesses to the ASR status port, and the other two terms deglitch the function.

The HB_STAT_DEC signal is also generated by the SRDLOW PAL 90. The HB_STAT_DEC signal is a decode signal for accesses to the status port at address 0C4Ch. This register is not fully decoded for other reasons, so that the HB_STAT_DEC signal is actually asserted for accesses to addresses 0C4C-0C4Fh.

When the computer C is operating properly, the ASR timer 86 is not permitted to time out, but is instead periodically reset. An operating system (OS) driver, which is a periodically scheduled routine in the computer's operating system, is responsible for enabling the ASR timer during initialization, periodically reloading the ASR timer, and disabling the ASR timer if the system C is being shut down. The OS driver further logs system failure information into a health log to be analyzed later for diagnosing a critical error.

The OS driver disables and reloads the ASR timer 86 at approximately one minute intervals. Because the countdown value in the preferred embodiment is never less than five minutes, the ASR timer 86 does not time out as long as the OS driver is functioning. It is understood that other time values could be utilized. The OS driver disables the ASR timer 86 by writing a value of 38h to an ASR timer control port 0C4Bh, which disables the ASR timer output. The data port is then written with the original countdown value, the ASR timer 86 output is enabled, and the ASR timer 86 starts counting down from the new initial countdown value.

Thus, the PWRGOOD signal remains high and the system is not reset as long as the ASR timer 86 asserts a high signal, indicating that the ASR timer 86 has not timed out. If the power supply 84 fails, however, the drop in the 5 volt PGOOD signal causes the PWRGOOD signal to be asserted low and causes the system to reset. Similarly, timeout of the ASR timer 86 due to a system failure also causes a reset.

To prevent inadvertent resets, the TIMER_MASK signal is set to zero when the system C is power cycled normally, but is not affected by a system reset caused by the ASR timer 86. This is because the ASR timer 86 powers up with a random value after a conventional power cycle, but is known to have a zero value and by disabled after an ASR reset, so the timer cannot count down and inadvertently reset the system, and assertion of the TIMER_MASK signal is therefore unnecessary. The TIMER_MASK signal is asserted by writing to port 0C4Ch with any value, and the signal remains at logic level low until the computer is power cycled. This is performed by the following equation implemented in the ROMSEC PAL 82.

/TIMER_MASK=PGOOD * TIMER_MASK+PGOOD
   * HBSTAT_OE * IOWC

Before the write operation occurs, however, the computer determines whether the most recent reset was caused by a normal power cycle or the ASR timer 86 by reading the status of the TIMER_MASK signal at bit 0 of port 0C4Ch. If the bit is set, an ASR reset has occurred, and if it is cleared, the computer C has been power cycled normally.

To read bit 0 of port 0C4Ch, a tri-state buffer 92 receiving bit 0 must be enabled. The enable input of the buffer 92 is connected to the output of an NAND gate 94 having a first input connected to an SD0_EN signal generated by the ROMSEC PAL 82, and a second input connected a CMD_CLR signal generated by the ROMDEC PAL 88. The CMD_CLR signal is generated according to the following equation:

CMD_CLR=CMD * /RESET

The /CMD signal is a conventional EISA control signal, used in this case for PAL address decoding. The RESET signal is the system RESET signal from the EBC 32.

The SD0_EN signal is governed by the following equation:

SD0_EN=HBSTAT_OE * /RESET * IORC

As previously indicated, the HB_STATOE signal is asserted when ports 0C4Ch-0C4F are asserted under the proper conditions. The IORC signal is equivalent to the ISA IORC signal, indicating an I/O read command when asserted. Thus, the buffer is enabled when the proper address and control signals are asserted to read port 0C4Ch.

The ASR system uses various registers and I/O locations to store data relevant to the status of the ASR system. In particular, the ASR system of the preferred embodiment stores a set of ten environment variables (EVs) in the non-volatile memory 47 which are accessible to the system and provide various information regarding the status, condition, and options of the ASR system. A POWER ON SELF TEST EV reflects whether the ASR timer 86 has passed an ASR power on self-test (POST) program. An ASR RESET EV reflects whether the most recent system reset was caused by the ASR timer 86, based on the previously read TIMER_MASK signal and an ASR RESET flag, described below. An ASR ENABLED EV reflects whether the ASR timer is to be enabled by an OS driver during initialization, and a BOOT OPTION EV indicates a boot option selected by the user, as explained below. Yet another EV, a REBOOT LIMIT EV, stores the number of consecutive times the ASR system may attempt to reboot the computer C. Similarly, a REBOOT COUNT EV counts the number of times the ASR system has attempted to reboot the computer C since the last conventional reset. A PAGER ENABLED EV, a PAGER NUMBER EV, a PAGER PORT EV, and a PAGER MESSAGE EV indicate whether a pager feature is enabled or disabled, the pager number, the particular pager communications port to be used, and a seven digit ID number to be provided as a pager message, respectively.

Figure 3:
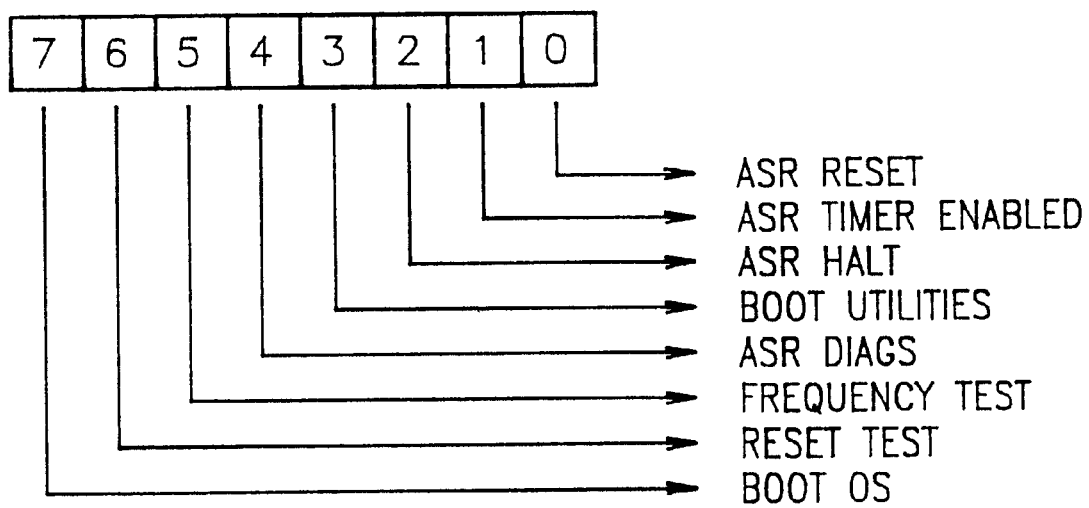
FIG. 3 is a diagram of the ASR byte located in the CMOS memory.

The computer system C also utilizes an ASR byte stored in non-volatile RAM, preferably the RTC/CMOS 46. Each of eight ASR flags of the ASR byte individually represents a particular status of the ASR system, and all are illustrated in FIG. 3. The ASR RESET flag indicates whether the most recent system reset was caused by the ASR timer. The ASR TIMER ENABLED flag indicates whether the ASR timer is enabled, and the ASR HALT flag denotes whether the program should halt due to a system memory error. The BOOT UTILITIES flag controls whether the system C should boot to the diagnostics program, and overrides the BOOT OPTION EV, as discussed below. The ASR DIAGS flag indicates whether an ASR diagnostics program is in progress. The FREQUENCY TEST and the RESET TEST flags are set when the ASR timer 86 is successfully tested, and finally, the BOOT OS flag indicates that the computer C should boot to the operating system, and also overrides the BOOT OPTION EV.

The computer system of the preferred embodiment also includes a health log, in which a record of hardware and software errors is maintained. When an error occurs, the type of error and the time it occurs is recorded in the health log by the OS driver. The error is recorded in the health log regardless of whether the error causes a system reset. The health log contents may be read at a later time to determine the cause of failures and other system problems.

Figure 4:
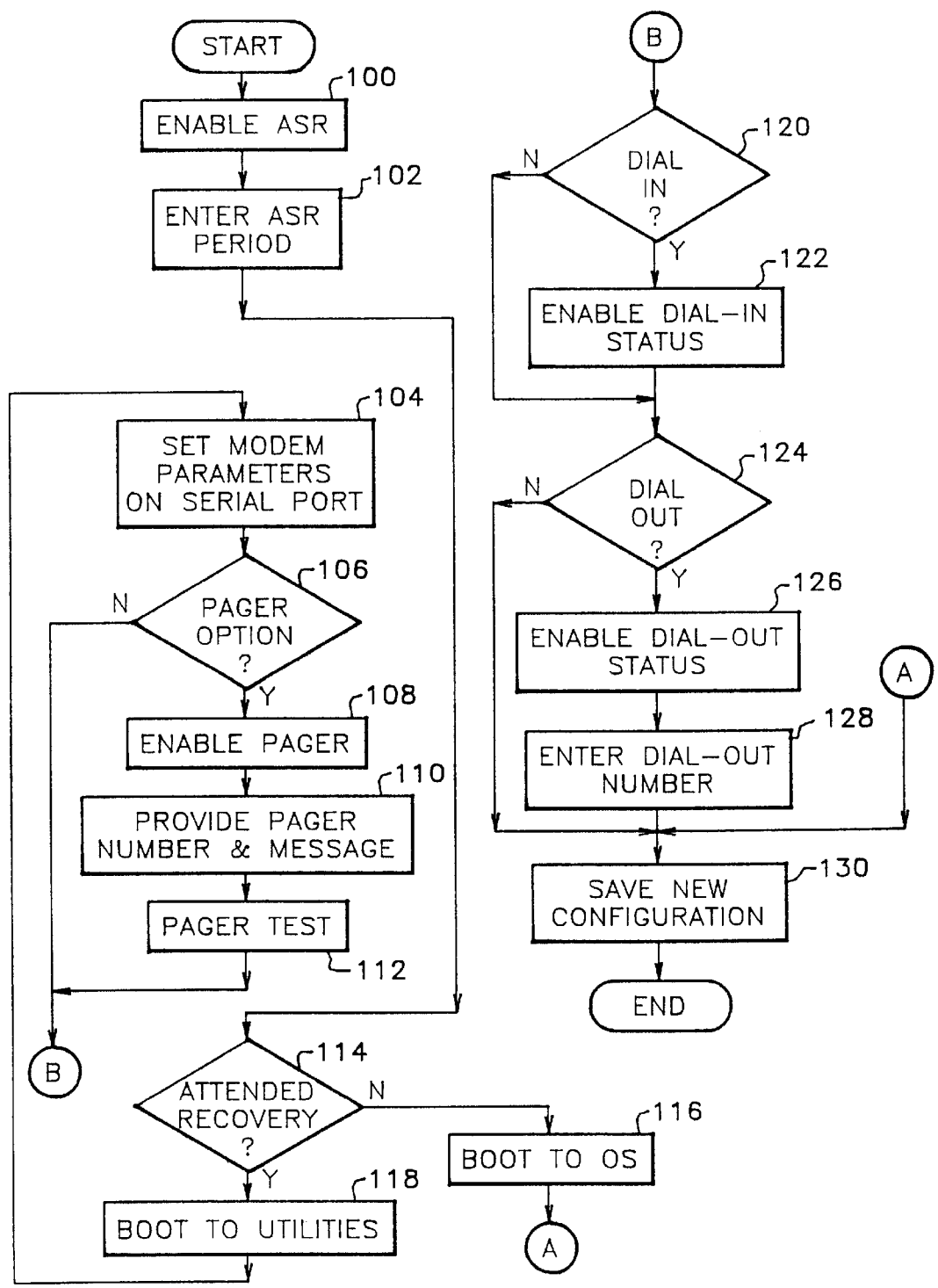
FIG. 4 is a flowchart diagram of the configuration program for setting up the ASR timer.

The ASR system is configured by executing an ASR configuration program, which is illustrated in FIGS. 4A–4B. When the ASR configuration program is initiated in step 100, the ASR timer 86 is enabled if the user so selects. If the ASR timer is not enabled, the rest of the ASR configuration program is not executed. If the timer is enabled, the ASR ENABLED EV is set and the user is prompted to enter an ASR period in step 102. The ASR period is the amount of time that passes following a system failure before the ASR timer 86 causes a reset and attempts to reboot. The selected ASR period generates the countdown value provided to the ASR timer 86. In the preferred embodiment, the ASR period may be 5, 10, 15, 20, or 30 minutes. After the ASR period is selected by the user, in step 114, the user is prompted to choose attended or unattended recovery, and the selection is stored in the BOOT OPTION EV. If the attended recovery option is selected, the computer boots to the diagnostics program located in the secondary partition of the hard drive 53 so that the administrator may diagnose the cause of the error. Conversely, unattended recovery boots to the operating system stored in the primary partition. Thus, if unattended recovery is chosen, the BOOT OPTION EV is set in step 116 so that the computer boots to the operating system, and if attended recovery is chosen, the BOOT OPTION EV is set in step 118 to boot the system to the diagnostics program. If the diagnostics option is chosen, control proceeds to step 104, where modem parameters are provided for the serial ports, and the user is then prompted in step 106 whether the ASR alert option is to be enabled. If enabled, the ASR alert option causes the computer to call the administrator's pager in the event of a computer failure. The PAGER ENABLED EV is set in step 108 and the user provides the proper modem communications port, pager number and a unique message in step 110 for the PAGER PORT, PAGER NUMBER and the PAGER MESSAGE EVs to alert the administrator when the computer system fails. To test the pager number, the user may select a pager test option in step 112, in which the pager number is immediately dialed and the message conveyed to the pager. It is noted that this test cannot be done in the same operation as setting the modem parameters in step 104, as the modem parameters must first be saved and then applied to the modem, which is done at a later time, so the pager test requires a second entry int0 the ASR configuration program.

After step 112 or if the alert option is disabled in step 106 the user then indicates in step 120 whether to enable the dial-in feature of the computer system in step 122, which allows the user to call the computer modem from another terminal and execute the diagnostics program remotely. Next, control proceeds to step 124 and the user chooses whether to enable the dial-out feature, which, if enabled, causes the system to dial out through the modem to a remote terminal when the system is rebooted. If this option is enabled in step 126, the proper dial-out number must be provided in step 128. If both the dial-in and dial-out options are enabled, the computer system C attempts to dial out a preset number of times, and if unsuccessful, sets the modem to receive a dial-in call. If neither is selected, the computer C may only be accessed locally. Control then proceeds to step 130 and the new configuration information is saved.

After the ASR timer is enabled and the computer system C is operating, the ASR timer 86 continuously counts down from its user-selected value. The OS driver, however, prevents the ASR timer 86 from counting down and resetting the system C. If the computer system C suffers a critical error, however, the operating system ceases operations, including the OS driver. Consequently, the ASR timer 86 counts down and eventually asserts the HB_TIMER_OUT signal. If the HB_TIMER_OUT signal is not masked, which is normally unmasked after the computer C boots, the PWRGOOD signal is negated to the clock circuitry 80 for 36 ms and the system C resets.

Figure 5:
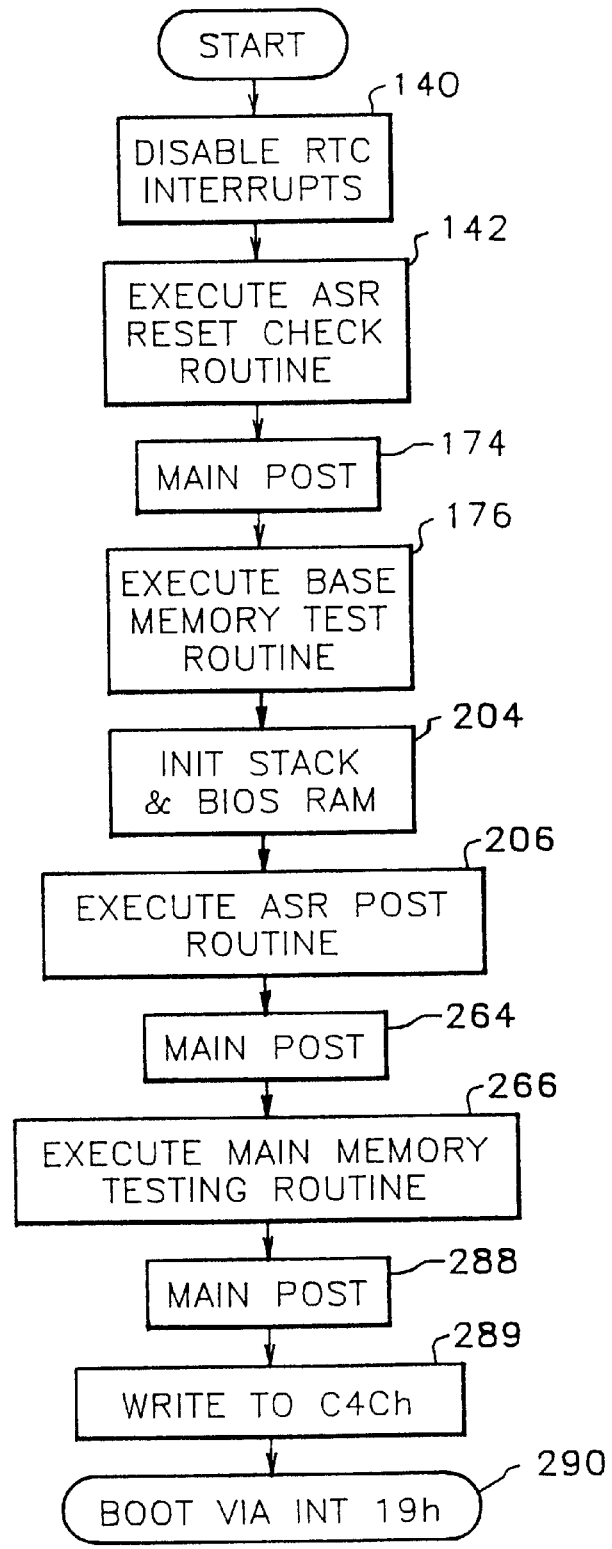
FIG. 5 is a flowchart diagram of operations of the main power on self test (POST) program for the computer system.
Figure 6:
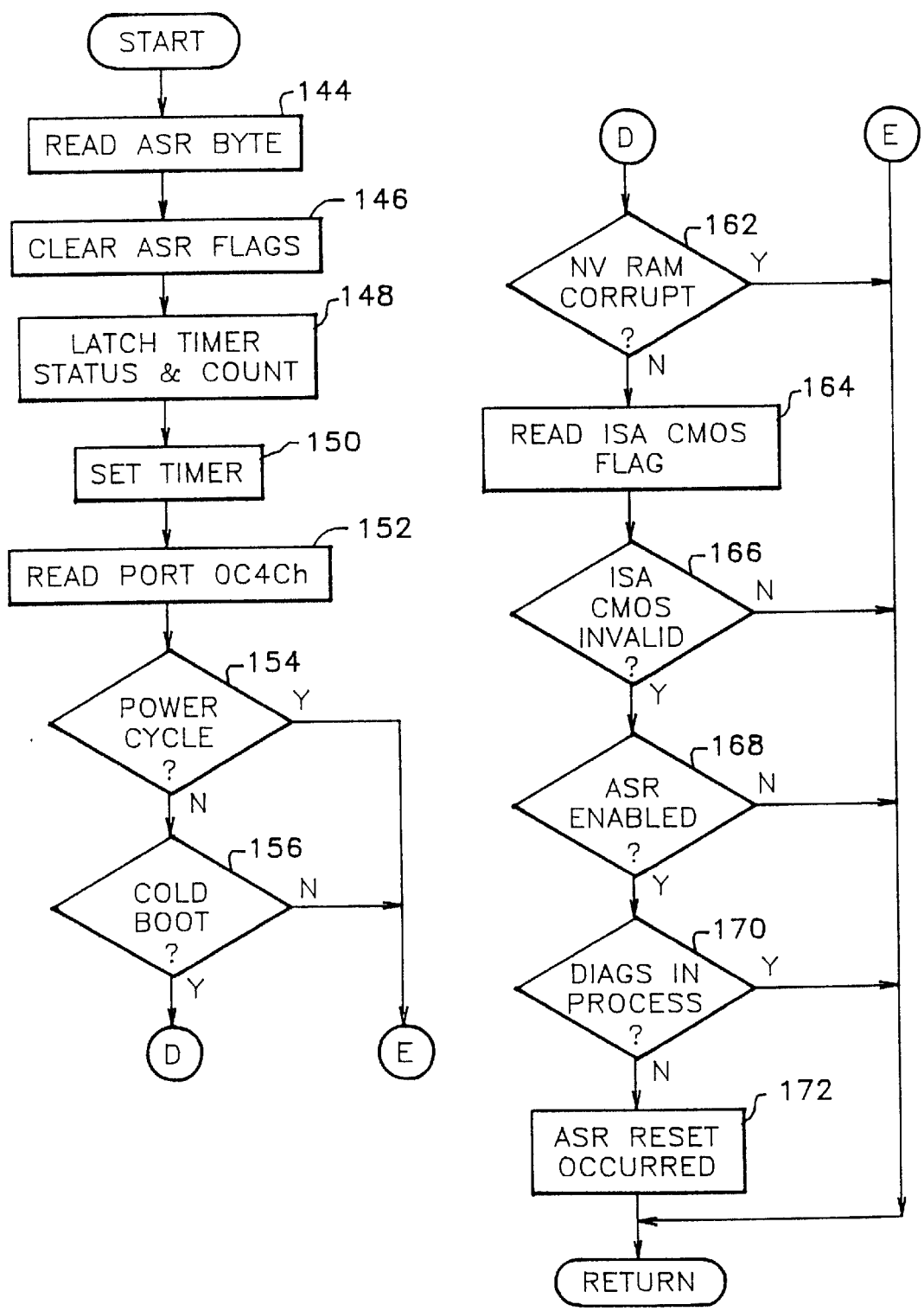
FIG. 6 is a flowchart diagram of a routine for determining whether the most recent system reset was caused by the ASR timer.

Upon reset, the computer C executes its power-on self test (POST) program. Many tasks performed in the main POST program are common to various computer power up routines and are not necessarily of particular relevance to the present invention, and therefore are not described in detail. Referring now to FIG. 5, the computer system C first disables all RTC interrupts in step 140. Control proceeds to step 142, where the system executes the ASR reset check routine, which is shown in FIGS. 6A–6B. When the routine is called in step 142, the ASR flags contained in the CMOS 46 are read in step 144. The ASR RESET, BOOT UTILITIES, HALT, and BOOT OS flags are cleared in step 146 because each of the flags is valid only for a single cycle of the main POST program, and the current ASR timer value is then latched in step 148. Next, the ASR timer 86 is set to a known state in step 150 so that the ASR timer does not continue counting during the POST program and trigger another system reset.

Next, it must be determined whether the ASR timer caused the most recent system reset in order to properly boot the system. Thus, control proceeds to step 152, and bit 0 of port 0C4Ch is read, which indicates whether the system C was power cycled normally or reset by the ASR timer. Control proceeds to step 154 where the routine exits if the system was power cycled conventionally. Control then proceeds to step 156 where it is determined whether the current boot is a cold boot. If not, the routine exits, because an ASR reset causes a cold boot. Control proceeds to step 162, there if the data in the NV RAM 47 is corrupt, the ASR flags will be unreliable, the routine exits. Next, the system reads a CMOS flag in step 164 which indicates whether the CMOS memory is valid. If not, the routine exits at step 166, and if so, control proceeds to step 168 where it is determined from the ASR TIMER ENABLED flag whether the ASR timer is enabled. If not, the routine exits, and if so, control proceeds to step 170 to determine whether the ASR diagnostics program is in progress. If so, the program exits. If none of the above conditions causes the routine to exit, an ASR timer timeout must have triggered the reset, and control proceeds to step 172 where it is indicated that an ASR reset has occurred by setting the ASR RESET flag.

Control returns to the main POST program and proceeds to step 174 where all pending RTC interrupts are cleared. The battery power of the computer system C is tested, and a CMOS diagnostics register is reset. Next, bell, parity and I/O check functions are disabled. A first RAM refresh timer is initialized to get the RAM into operation. A system timer 0 and a system timer 2 are then initialized. Next, the floppy drive motors are turned off and a set of display adapters are disabled. Then the display is cleared, the video system is turned on, and timer 0 is tested.

Figure 7:
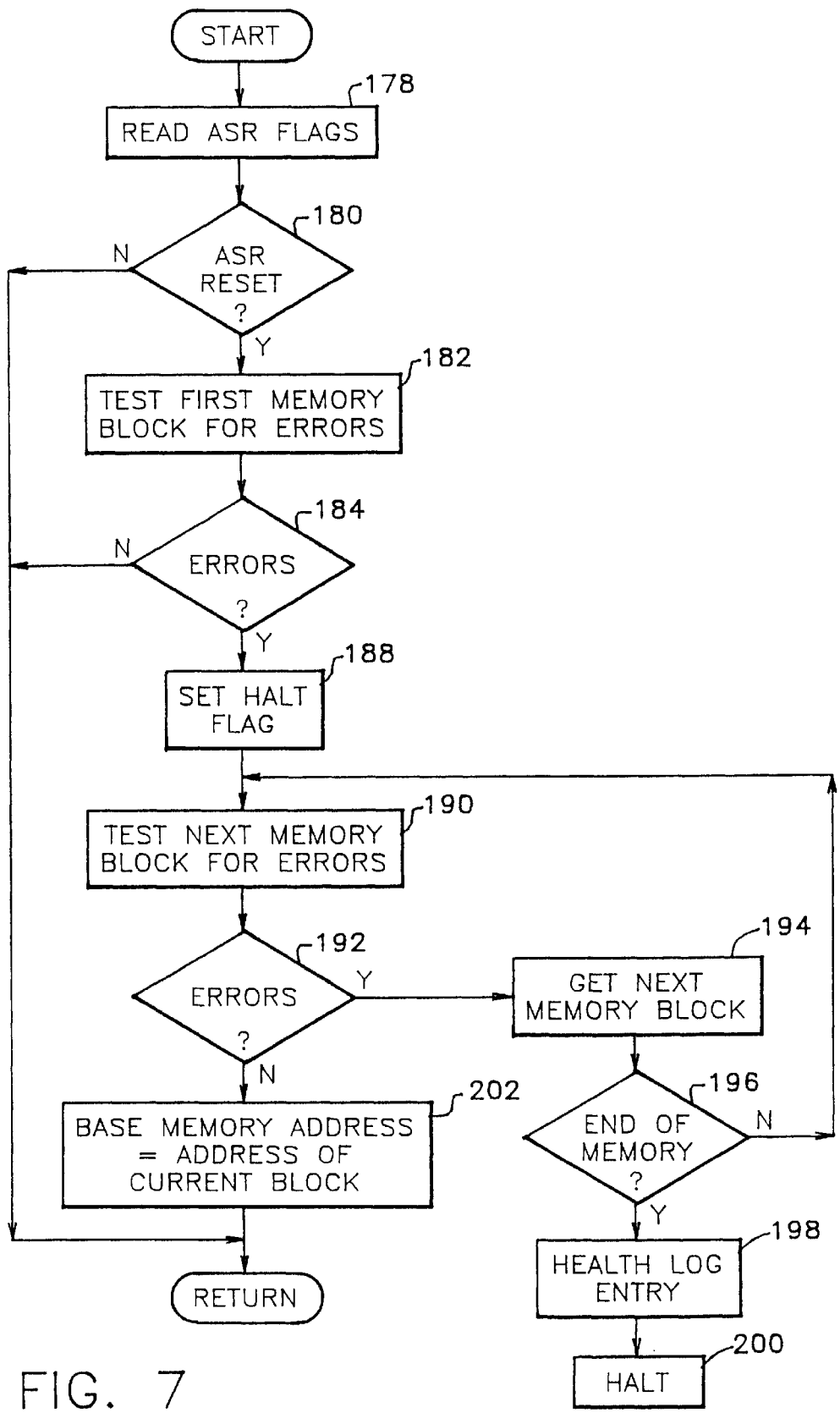
FIG. 7 is a flowchart diagram of operations for determining whether a base section of memory is operational.

In step 176, a base memory testing routine is called, which is disclosed in more detail in FIG. 7. The base memory test routine is required to find a 128 kbyte block of RAM to use for a stack memory for the remainder of the POST program. When the routine is initiated, the ASR flags are read from the NV RAM 47 in step 178. Control proceeds to step 180, where it is determined whether the last reset was caused by the ASR timer according to the ASR RESET flag. If not, the routine exits. If so, in step 182, a first base 128 kbyte block of memory is tested and checked for errors. In step 184, it is determined whether any errors were detected, and if not, control proceeds to step 186, where the routine returns. Because the program has found a good section of memory to use for the stack, no further memory is currently needed and the POST program continues.

On the other hand, if parity errors are detected, control proceeds to step 188, where the ASR HALT flag is set indicating that a halt is required following an ASR alert routine, which is executed later. The HALT flag is necessary because the base memory is faulty, but the HALT is not enforced until after the administrator is notified of the failure by the ASR alert routine. In the meantime, control proceeds to step 190 where a next block of memory is tested for parity errors, and control proceeds to step 192 to determine whether any errors were detected. If so, the next block of memory is designated in step 194. In step 196, if the next block is the last block in the system memory, the entire memory has been unsuccessfully tested, and control proceeds to step 198 where an entry is logged in the health log indicating that the system could not be successfully reset due to lack of base memory for the stack. Control then proceeds to step 200 and the POST program halts. If the next block is not the last block in the system memory, however, control returns to step 190, and the new block is similarly checked for errors. When an operational block of memory is found, control proceeds to step 202 and the operational block of memory is designated as the base memory. Control then proceeds to step 186 and the routine exits.

Returning to the main POST program, control proceeds to step 204 where the stack and the BIOS RAM are initialized.

Figure 8A:
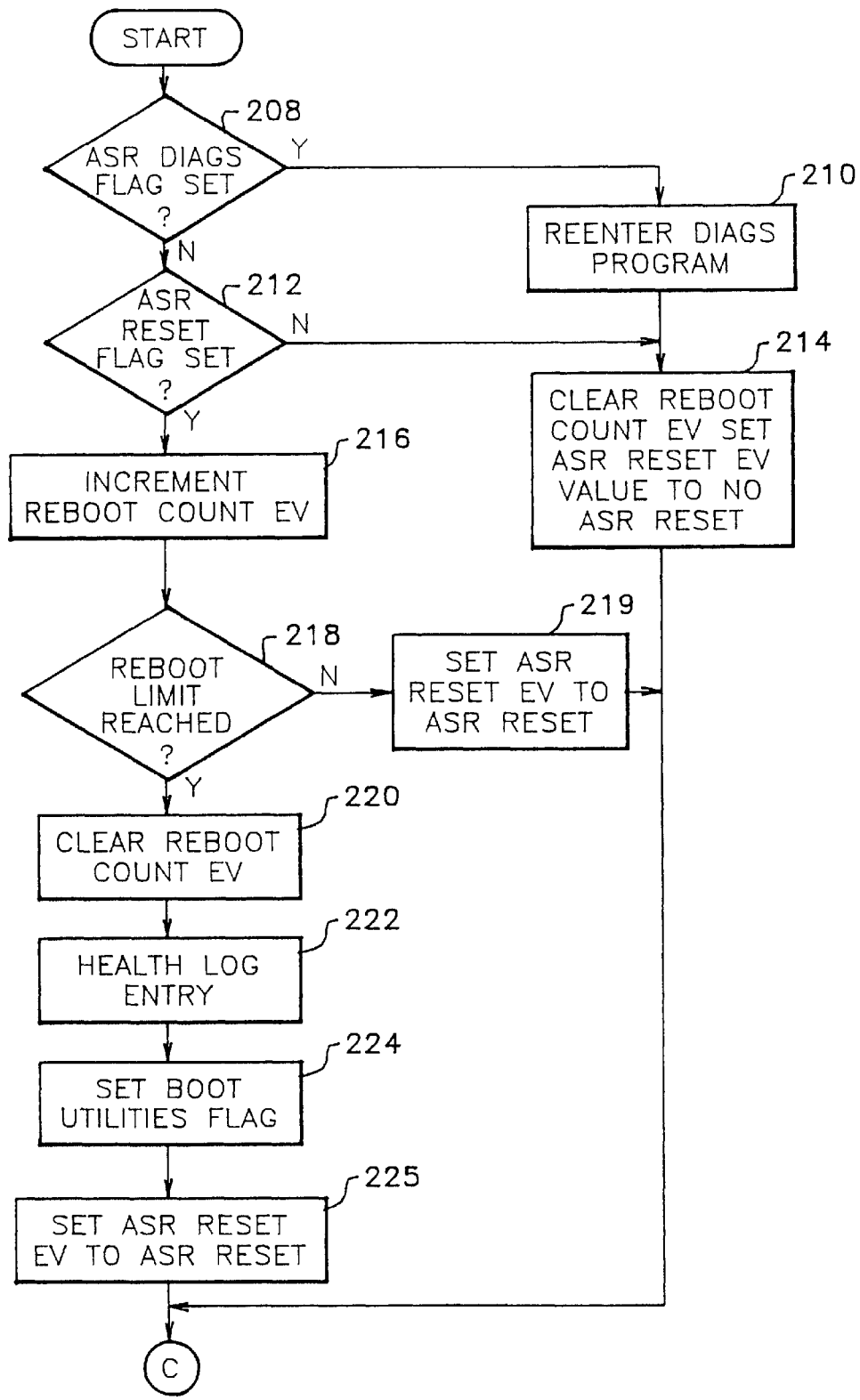
FIGS. 8A–8B are a flowchart diagram of operations for testing and activating the ASR timer.
Figure 8B:
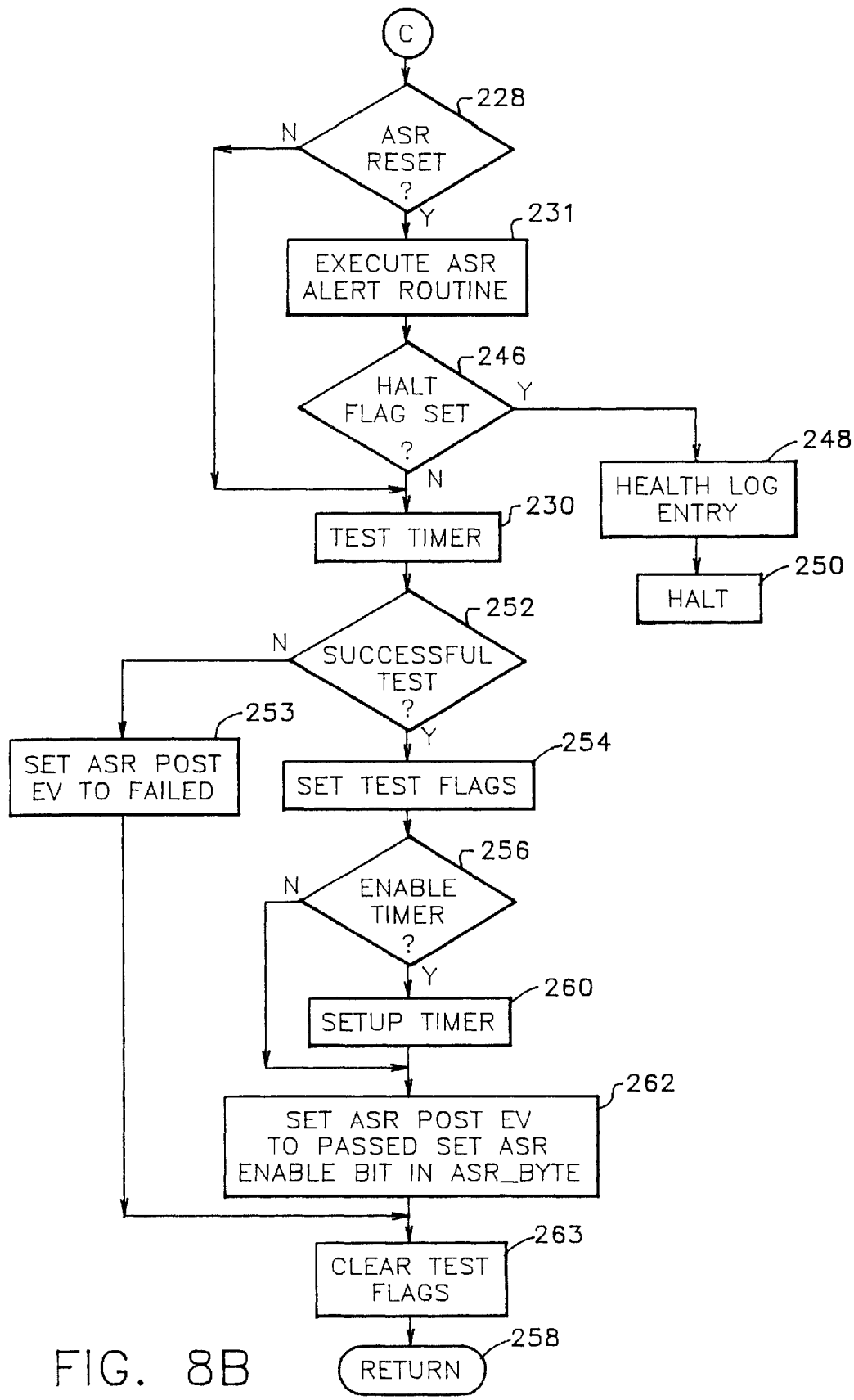

Next, control proceeds to step 206 where the ASR POST routine is executed, which is illustrated in FIGS. 8A–8B. This routine sets up and activates the ASR timer. In step 208, it is determined whether an ASR diagnostics program is running by reading the ASR DIAGS flag. If so, control proceeds to step 210, and the diagnostics program is reentered. If not, control proceeds to step 212 where the ASR RESET flag is read to determine whether the ASR timer caused the most recent computer reset. If not, control proceeds to step 214, where the REBOOT COUNT EV is reset to zero, because the system was conventionally reset, and the ASR RESET EV is set to indicate no ASR reset. If the ASR timer did cause the last reset, control proceeds to step 216, where the REBOOT COUNT EV is incremented. The updated REBOOT COUNT EV value is then compared with the REBOOT LIMIT EV in step 218 to determine whether the system has consecutively attempted to reboot the computer the maximum number of times. If not, control proceeds to step 219 to set the ASR RESET EV to indicate an ASR reset and then to step 228. If so, control proceeds to step 220, where the REBOOT COUNT EV is reset to zero, and then to step 222 where an entry is made in the health log indicating that the system attempted to reboot the maximum number of times. The BOOT UTILITIES ASR flag is then set in step 224 which overrides the user's boot option selection so that the computer system C boots to the diagnostics program instead of again attempting to boot to the operating system, assuming the diagnostic program is actually present. Control then proceeds to step 225, where the ASR RESET EV is set to indicate an ASR reset. Control then proceeds from step 214 or 225 to step 228.

In step 228 it is again determined from the ASR RESET flag whether the most recent system reset was caused by the ASR timer. If not, control proceeds to step 230 to immediately test the timer. If so, the system executes the ASR alert routine in step 231.

Figure 9:
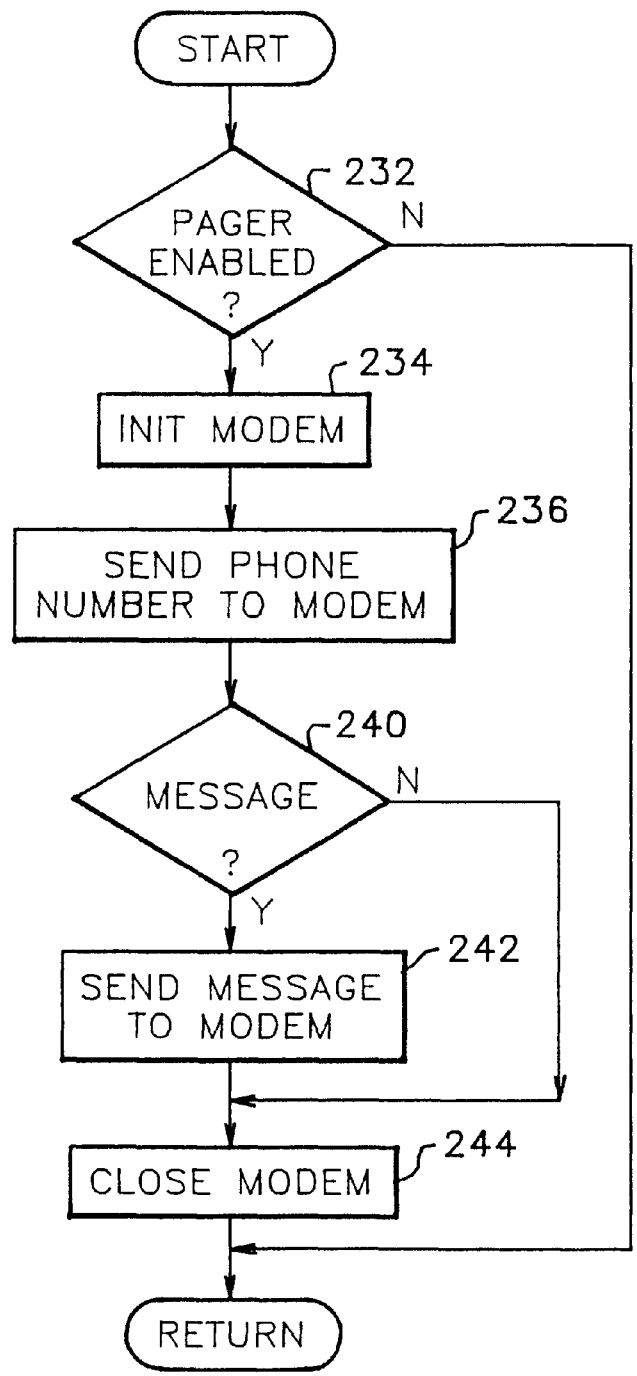
FIG. 9 is a flowchart diagram of operations for activating a pager following an ASR reset.

Referring now to FIG. 9, the ASR alert routine first reads the PAGER ENABLED EV in step 232 to determine whether the ASR alert routine should be executed. If not, the routine is not executed and control returns to the main POST program. If the pager function is enabled, control proceeds to step 234, where the modem is initialized, and then to step 236, in which the pager number is read from the PAGER NUMBER EV and provided to the serial port designated by the PAGER PORT EV corresponding to the modem.

Next, in step 240, the PAGER MESSAGE EV is read to determine whether a message is stored to be sent. If so, control proceeds to step 242, and the message is provided to the modem. After the message is sent, or if no message is available, control proceeds to step 244 and the modem is closed. Finally, control returns to the ASR POST program.

Referring again to FIG. 8B, control then proceeds to step 246 where it is determined whether the ASR HALT flag is set. If so, the HALT flag indicates that the base 128 kbyte block of memory is non-functional, and control proceeds to step 248 where the faulty base memory is logged in the health log. Control then proceeds to step 250 and the program halts.

If the HALT flag is not set, control proceeds to step 230 where the ASR timer is tested. In step 252, the results of the test are checked to determine whether the timer is functioning properly. If not, control proceeds to step 253 where the ASR POST EV is set to failed and control proceeds to step 263. If the tests were successful, the FREQUENCY TEST and RESET TEST flags are set in step 254, indicating that the ASR timer 86 is functional. Control proceeds to step 256 where it is determined whether to enable the timer by reading the ASR ENABLED EV. If not, control proceeds to step 262 and if so, control proceeds to step 260 where the ASR timer 86 is loaded with an initial countdown value and enabled. Control then proceeds to step 262 where the ASR POST EV is set to passed and the ASR enable flag is set. Control then proceeds to step 263, where the FREQUENCY TEST and RESET TEST flags are cleared. Control then proceeds to step 258, a return to the calling routine.

Control returns to the main POST program at step 264 where the VDU adapters are initialized. The system ROM and CMOS are tested as well as the DMA controller and page registers.

Figure 10:
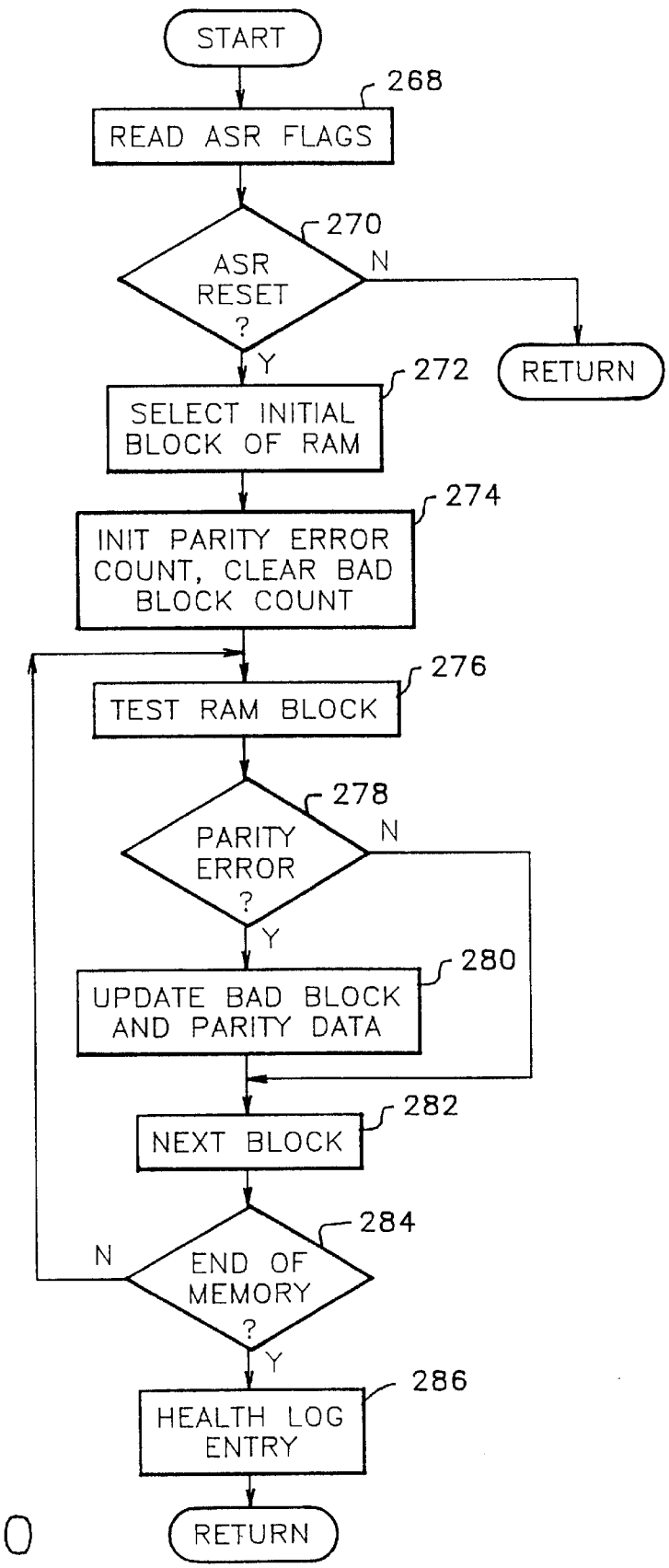
FIG. 10 is a flowchart diagram of operations for testing for faulty sections of the memory array.

Control then proceeds to step 266, where the main memory testing routine is executed, which is represented by the diagram of FIG. 10. At step 268, the ASR byte is read. Control proceeds to step 270, where is determined from the ASR RESET flag whether the most recent reset was an ASR reset. If not, control returns to the main POST program. If so, control proceeds to step 272 where an initial block of RAM is selected. Control then proceeds to step 274, where a parity error counter and a faulty block counter are cleared. Control proceeds to step 276 where the current RAM block is tested. Control then proceeds to step 278 where it is determined whether any parity errors occurred. If so, control proceeds to step 280 where the faulty block counter and the parity data counter are incremented appropriately. In addition, the location of the faulty memory block is added to a faulty memory block list stored in non-volatile memory 47. Control proceeds to step 282 where a next block of RAM is designated. Control then proceeds to step 284 where it is determined whether the new block of RAM is the end of the system memory. If not, control returns to step 276 and the block of RAM is identically tested. If so, control proceeds to step 286 where the detection of any bad memory blocks is logged in the health log.

Control then returns to step 288 of the main POST program where the computer's master clear is asserted and the DMA controllers are initialized. The computer C proceeds to test the keyboard controller. The POST program then tests the real and extended memory, and tests the system cache 22. Memory cacheability is programmed. Next, the ASR DIAGS flag is cleared, and the system interrupts are enabled. The time of day from the RTC is initialized, and the system checks and tests the keyboard 54 for stuck keys and the keyboard interface 52. Next, the A20 line is set to 0 and the CPU speed is set. The floppy controller 48 and drive 50 are initialized and tested, as are the fixed disk controller and drives. The parallel port and corresponding printer are then initialized, and option ROMs are searched and called. Next, the system configuration is checked, and the screen is cleared and the cursor is set. The time is checked for validity, and the computer system C generates an audible signal. Finally, the reset word for a soft reset is cleared, and control is transferred to step 289, where a write operation is performed to port address 0C4Ch to set the TIMER_MSK signal, and then to the appropriate boot program via the interrupt 19H signal in step 290.

Figure 11A:
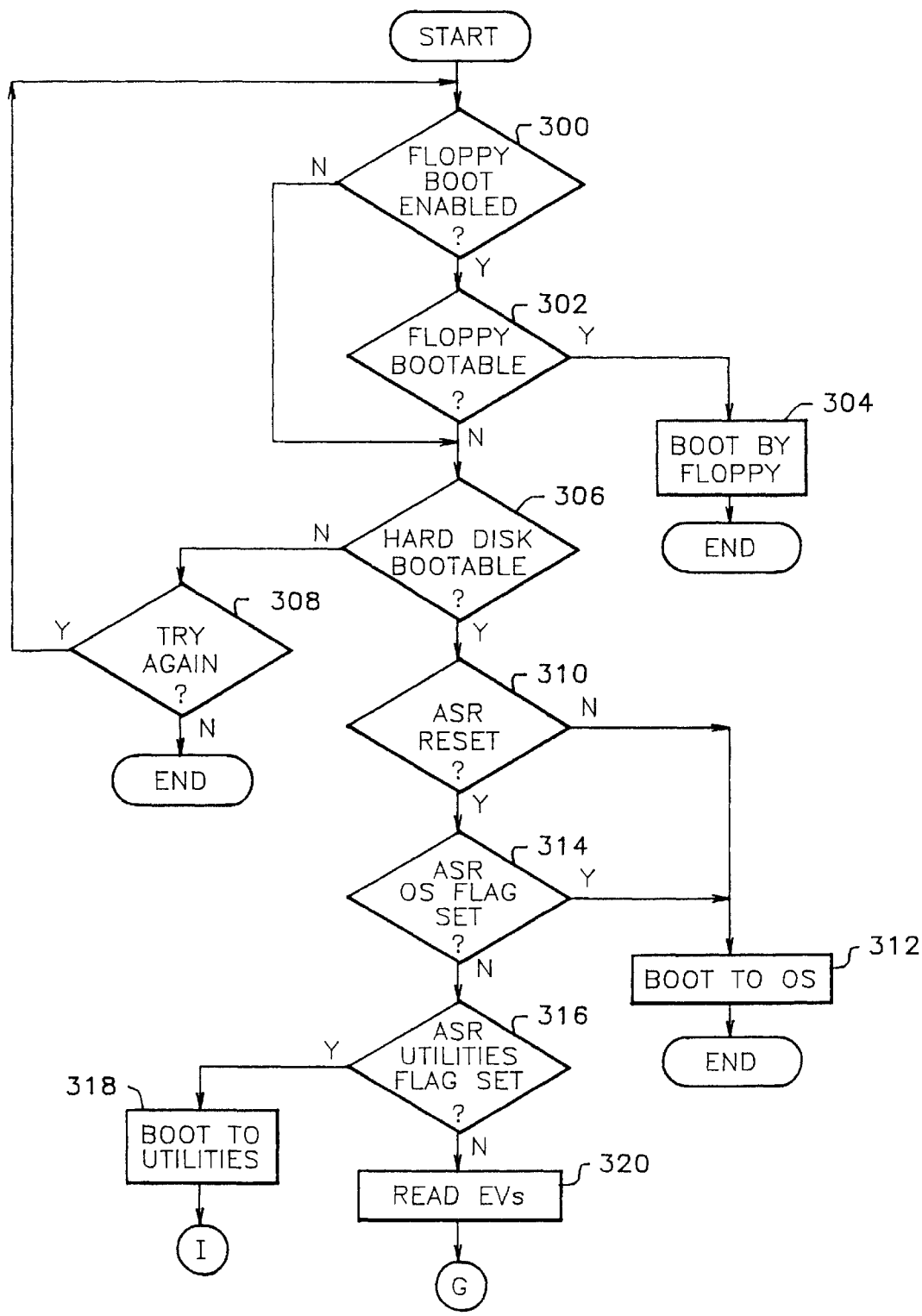
FIGS. 11A–11C are a flowchart of operations for booting the computer and providing operator access following an ASR reset.
Figure 11B:
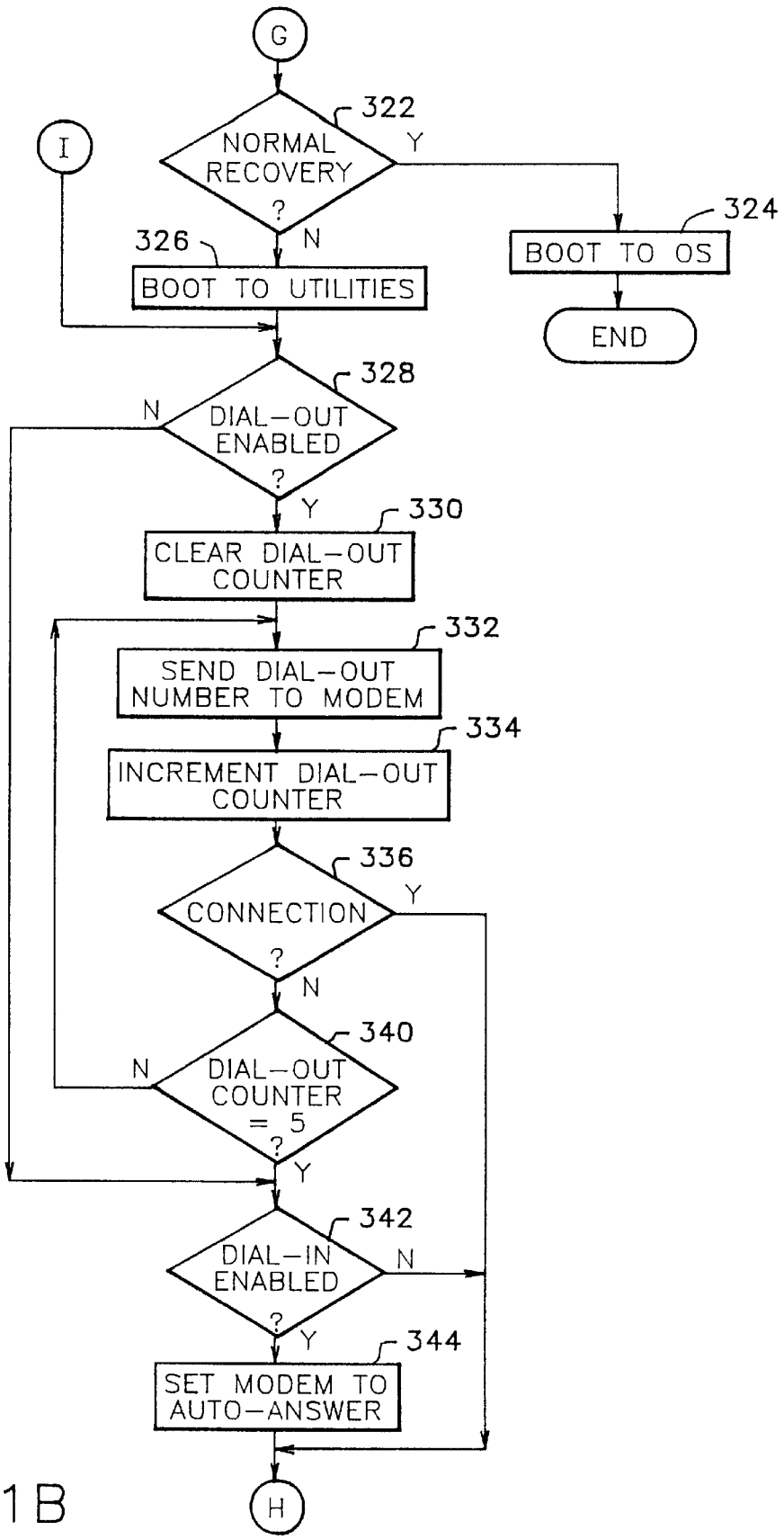
Figure 11C:
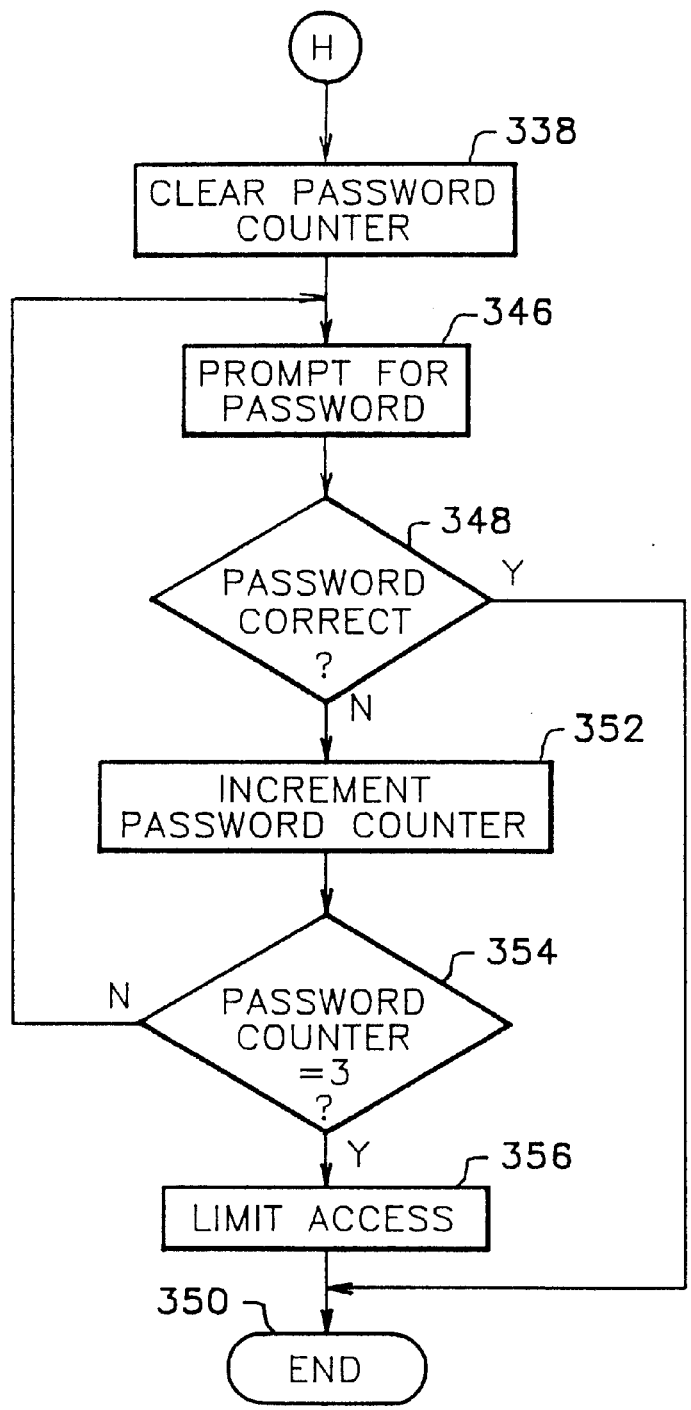

When the computer system is ready to boot, interrupt 19h (INT 19h) is asserted and the system begins to boot. As shown in FIGS. 11A–11C, the computer first determines whether the floppy drive is enabled for booting in step 300. If so, control proceeds to step 302 to determine whether a disk is present in the floppy drive with a bootable sector from which to boot, and if so, control proceeds to step 304 and the system boots from the floppy disk 50. If not, control proceeds to step 306 and it is determined whether the hard disk 51 includes a bootable partition. If not, control proceeds to step 308 where a message is provided to the user indicating the error condition, and prompts the user to select whether to try to boot again. If so, control returns to step 300 to attempt to boot again. On the other hand, if the hard drive 53 is bootable, control proceeds to step 310 where it is determined from the ASR RESET flag whether the most recent reset was caused by the ASR timer. If not, control proceeds to step 312 and the system boots to the operating system. If the last reset was caused by the ASR timer, control proceeds to step 314 where the ASR BOOT OS flag is read. If the BOOT OS flag is set, it overrides the BOOT OPTION EV, and the system boots to the operating system in the hard drive's primary partition in step 312. Next, control proceeds to step 316 where the BOOT UTILITIES flag is read. If the BOOT UTILITIES flag is set, control proceeds to step 318, and the computer boots to the diagnostics program in the secondary partition of the hard drive. If not, control proceeds to step 320 where the BOOT OPTION EV is read, which indicates whether the ASR system is set up for a normal or a diagnostic recovery. In step 322, control proceeds to the appropriate program in the primary partition in step 324 or in the secondary partition in step 326, according to the values stored in the EVs.

If the computer boots to the diagnostics program, control proceeds to step 328 to determine whether the dial-out feature is enabled. If so, control proceeds to step 330, and a dial-out counter is cleared, and in step 332, the dial-out number is provided to the modem. Control proceeds to step 334 and the dial-out counter is incremented. If the dial-out is successful and a connection is established in step 336 with another modem, control proceeds to step 338. If not, control proceeds to step 340, where the dial-out counter is read. If the system has attempted to dial out five times, control proceeds to step 342 and the dial-out feature is foregone. If not, control returns to step 332 and the dial-out process is tried again.

Control then proceeds to step 342, where it is determined whether the dial-in feature is enabled. If not, control proceeds to step 338 and the dial-out and dial-in features are bypassed so that the computer C is only accessible locally. If the dial-in feature is enabled, control proceeds to step 344 and the modem is placed in auto-answer mode.

Control then proceeds to step 338 after a connection to a remote terminal is established, and clears a password attempt counter. Control then proceeds to step 346 where the computer prompts the user for a password. If the proper password is provided in step 348, control proceeds to step 350 and the user interacts freely with the diagnostics program. If the proper password is not entered, control proceeds to step 352, where the password attempt counter is incremented, and then to step 354, where it is determined whether three password attempts have been made. If not, control returns to step 346 and the user may again attempt to enter the correct password. If three attempts have been made, control proceeds to step 356 and the user is given limited access to the diagnostics program, but cannot save any configuration changes. Control then proceeds to step 350. If access is not limited, the user can then run the various diagnostic and setup programs provided to determine and possibly correct any problems.

The computer system C described above automatically detects a system failure and resets. After the system is reset, the computer C tests itself and resets the ASR timer. In addition, the computer C tests the system memory 28 for errors, and remaps the memory 28 so that nonfunctional sections of the memory 28 that might cause a system failure are not used. The computer system C further alerts a pager so that the computer administrator is alerted to the system failure and the cause of the failure may be remedied. After the system is reset and tested, the computer C then boots itself into the operating system or the diagnostics program according to the administrator's selection. To facilitate execution of the diagnostics program, the computer C may be directed to call a remote terminal on the modem, or the computer C may put the modem in answer mode to await access by the alerted computer administrator.

The foregoing disclosure and description of the invention are illustrative and explanatory thereof, and various changes in the size, shape, materials, components, circuit elements, wiring connections and contacts, as well as in the details of the illustrated circuitry and construction and method of operation, may be made without departing from the spirit of the invention.

What is claimed is:

1. A computer system, comprising:
   a failure detection circuit operable to generate a reset signal when a failure is detected, wherein said reset signal resets the computer system;
   a memory device capable of containing boot code, wherein said memory device includes a hard disk drive having a plurality of bootable partitions, one partition containing a normal operating system and another partition containing a diagnostic program; and
   a processor coupled to said memory device and responsive to said reset signal for booting the computer system from said memory device when said reset signal is generated.

2. The computer system of claim 1, wherein said failure detection circuit includes:
   a timer operable to load a countdown value and begin counting down from said countdown value, said timer operable to generate said reset signal when said timer reaches said countdown value.

3. The computer system of claim 2, wherein said failure detection circuit further includes:
   a masking circuit operable to mask said reset signal generated by said timer when said masking circuit is enabled, said masking circuit being enabled after the computer system is powered on.

4. The computer system of claim 3, further comprising:
   a software driver executable by said processor for disabling said masking circuit after determining a cause of the failure.

5. The computer system of claim 4, wherein said computer system is operable by a system operator wearing a pager, the computer system further comprising:
   a modem coupled to said processor;
   said software driver being operable to cause said modem to communicate with the pager in response to a failure.

6. The computer system of claim 1, further comprising:
   a nonvolatile memory device operable to store a bootable partition selection; and
   said processor being responsive to said bootable partition selection for booting the computer system to one of said hard disk drive partitions according to said selection.

7. The computer system of claim 6, further comprising:
   means for allowing remote access to the computer system for receiving commands when the computer system is booted to said diagnostic program partition.

8. The computer system of claim 7, wherein said means for allowing remote access includes:

a modem;
   means for indicating an incoming or outgoing access; and
   means for completing said indicated access direction.

9. The computer system of claim 1, further comprising:
   a diagnostic routine executable by said processor for testing the memory of the computer system in response to a failure;
   said diagnostic routine capable of logging faults found during the memory testing; and
   means for deallocating memory found to have faults during the memory testing.

10. A method of handling a failure in a computer system, the computer system including a hard disk drive having one or more bootable partitions and a nonvolatile memory device operable to store a bootable partition selector, the method comprising the computer implemented steps of:
    (a) detecting a failure in the computer system;
    (b) generating a reset signal when a failure is detected, said reset signal causing the computer system to reset; and
    (c) booting the computer system in response to said reset signal, the booting step utilizing boot code stored in a bootable partition which has been selected based on the bootable partition selector stored in the nonvolatile memory device.

11. The method of claim 10, wherein step (a) further comprises the steps of:
    (d) periodically initializing a timer while said computer system is operational;
    (e) causing said timer to begin timing after step (d); and
    (f) determining a failure has happened if said timer times out.

12. The method of claim 10, wherein step (b) further comprises the steps of:
    (g) masking said reset signal after the computer system is power on; and
    (h) selectably unmasking said reset signal if failure recovery is desired.

13. The method of claim 12, wherein after unmasking said reset signal, the method further comprises the steps of:
    (i) analyzing the failure for a cause of the failure; and
    (j) masking said reset signal after determining the cause of the failure.

14. The method of claim 10, wherein one partition contains a normal operating system and another partition contains a diagnostic program, the method further comprising the step of:
    (m) causing the computer system to allow remote access when the computer system is booted to said diagnostic partition.

15. The method of claim 14, wherein the computer system includes a main memory, the method further comprising the steps of:
    (n) testing the main memory after step (m);
    (o) logging faults found during step (n); and
    (p) deallocating a portion of main memory found to be faulty during step (n).

16. The method of claim 10, further comprising the step of:
    (q) causing the computer system to communicate with a pager in response to the failure.

* * * * *